United States Patent [19]
Bray et al.

[11] Patent Number: 5,373,255
[45] Date of Patent: Dec. 13, 1994

[54] LOW-POWER, JITTER-COMPENSATED PHASE LOCKED LOOP AND METHOD THEREFOR

[75] Inventors: Jeffrey P. Bray, Austin; Matthew A. Pendleton, Cedar Park; Steven E. Cozart, Austin, all of Tex.

[73] Assignee: Motorola, Inc., Schaumburg, Ill.

[21] Appl. No.: 98,974

[22] Filed: Jul. 28, 1993

[51] Int. Cl.$^5$ .................. H03L 7/089; H03L 7/091; H03L 7/093

[52] U.S. Cl. .................. 331/1 A; 331/17; 331/25; 331/27; 327/7; 327/159

[58] Field of Search .............. 331/1 A, 17, 25, 27; 307/516, 525, 526, 528; 328/133, 134

[56] References Cited

U.S. PATENT DOCUMENTS

| | | | |
|---|---|---|---|
| 3,989,931 | 11/1976 | Phillips | 331/27 X |
| 4,378,509 | 3/1983 | Hatchett et al. | 307/528 |
| 5,036,294 | 7/1991 | McCaslin | 331/1 A |
| 5,095,287 | 3/1992 | Irwin et al. | 331/1 A |
| 5,271,040 | 12/1993 | Clark | 329/307 X |

*Primary Examiner*—Siegfried H. Grimm
*Attorney, Agent, or Firm*—Paul J. Polansky

[57] ABSTRACT

A phase locked loop (PLL) (40) simultaneously has both relatively-low power consumption and relatively-low jitter on a clock output signal. The PLL (40) includes a phase detector (41) and a phase error accumulator (42) connected to the output of the phase detector (41). The phase error accumulator (42) samples an output of the phase detector (41) at a relatively-high clock rate, but accumulates these samples and provides an output thereof to a loop filter (43) at a relatively-low clock rate. Thus the PLL (40) captures short periods of phase delay to maintain low clock output signal jitter, while at the same time, however, the loop filter (43) need only adjust its output periodically, at the relatively-low rate, thereby saving power. The phase detector (41) detects a metastable condition on a phase detector latch (60) and resolves to an up pulse or a down pulse to further reduce clock output signal jitter.

22 Claims, 4 Drawing Sheets

LOW-POWER, JITTER-COMPENSATED PHASE LOCKED LOOP AND METHOD THEREFOR

FIELD OF THE INVENTION

This invention relates generally to electrical circuits, and more particularly, to phase locked loops.

BACKGROUND OF THE INVENTION

A basic phase locked loop (PLL) has a phase detector which provides a phase detect output signal indicative of the phase difference between a loop clock signal and a reference clock signal. The phase detector provides the phase detect output signal to an input of a loop filter. The loop filter is a lowpass filter which provides an output voltage level indicative of the length of time the phase detector detects the two clock signals are out of phase. The output of the loop filter drives an input of a voltage controlled oscillator (VCO). The VCO then provides a clock output signal having a desired frequency. The clock output signal is divided in a loop divider to provide the loop clock signal. Thus, the PLL is able to generate the clock output signal having a frequency that is many times greater than that of the reference clock signal, based on the value of the loop divider.

In a digital implementation, a phase detector provides a digital output to indicate a phase difference between the two input clock signals. For example, a three-state phase detector may provide a single output signal in a logic high state to indicate a leading phase between the reference clock signal and the loop clock signal, in a logic low state to indicate a lagging phase, and in a high impedance state to indicate a lock condition. Another type of digital phase detector, known as a type IV phase detector, provides one output signal in an active logic state, such as a logic high, to indicate the leading phase between the reference clock signal and the loop clock signal. The type IV phase detector also provides a second output signal in the active logic state to represent the lagging phase between the reference clock signal and the loop clock signal. The type IV phase detector provides both output signals in an inactive logic state to indicate the lock condition.

The digital loop filter then samples the output of the phase detector at a relatively high rate to accurately detect the amount of time the signals are out of lock. The loop filter provides a digital code based on the current and prior value of the samples. This type of PLL presents an inherent tradeoff between power consumption and sensitivity to clock jitter. If the loop filter samples the output of the phase detector at a relatively high rate, it more accurately represents the phase difference, and thus the PLL provides the clock output signal with low jitter. However, the high sampling rate increases power consumption. If the loop filter's sampling rate decreases, power consumption decreases but clock output signal jitter increases.

Another problem is that the digital phase detector circuit itself may cause unwanted signal jitter. When the loop clock signal is essentially locked to the reference clock signal, there may still exist some relatively-small phase difference between the two signals, such as a few nanoseconds (ns). However, the phase detector may be unable to accurately differentiate a difference this small. Thus, the phase detector's output on a transition of the clock signals is indeterminate and does not accurately reflect the actual phase difference. This results in increased signal jitter. A PLL which has both relatively-low power consumption and relatively-low clock output signal jitter would therefore be desirable.

SUMMARY OF THE INVENTION

Accordingly, the present invention provides, in one form, a low-power, jitter-compensated phase locked loop, comprising a phase detector, a phase error accumulation portion, a loop filter, a voltage controlled oscillator, and a loop divider. The phase detector has a first input for receiving a reference clock signal, a second input for receiving a loop clock signal, and an output. The phase detector provides a phase detect output signal at the output in response to a phase difference between the reference clock signal and the loop clock signal. The phase error accumulation portion is coupled to the phase detector, periodically samples the phase detect output signal with a sample clock, and accumulates over a predetermined number of periods of the sample clock an accumulated phase error. The loop filter has an input coupled to the phase error accumulation portion for receiving the accumulated phase error, and an output for providing a filtered output. The voltage controlled oscillator has an input coupled to the output of the loop filter, and an output for providing a clock output signal of the phase locked loop. The loop divider has an input for receiving the clock output signal of the phase locked loop, and an output for providing the loop clock signal.

In another form, the present invention provides a method for reducing power while maintaining low jitter in a phase locked loop. A phase difference between a reference clock signal and a loop clock signal is detected to provide a phase detect signal. The phase detect signal is sampled on a predetermined transition of a sample clock. A plurality of samples of the phase detect signal is accumulated to provide an accumulated phase error. The accumulated phase error is filtered in a loop filter. A clock output signal of the phase locked loop is provided with a frequency proportional to an output of the loop filter.

These and other features and advantages will be more clearly understood from the following detailed description taken in conjunction with the accompanying drawings.

BRIEF DESCRIPTION OF THE INVENTION

FIG. 3-1 and 3-2 illustrate in partial block diagram and partial logic diagram form first and second portions, respectively, of the phase detector of FIG. 2.

DETAILED DESCRIPTION OF A PREFERRED EMBODIMENT

Figure 1:
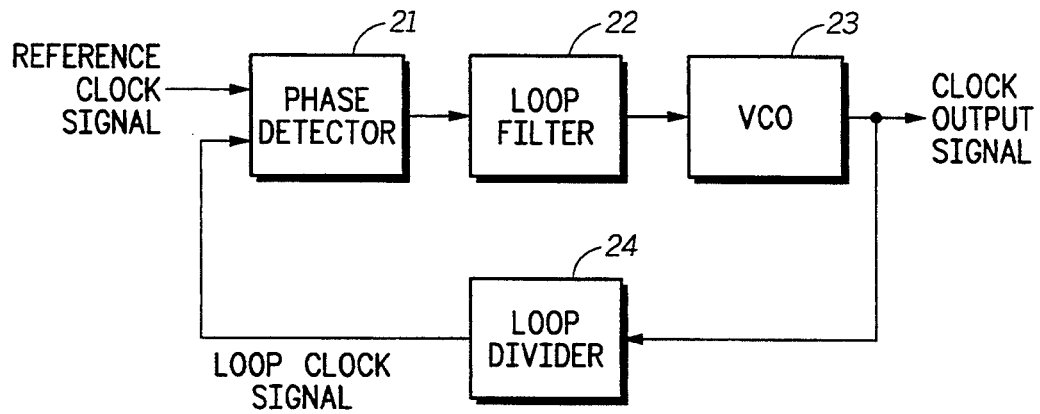
FIG. 1 illustrates in block diagram form a phase locked loop (PLL) according to the prior art.

FIG. 1 illustrates in block diagram form a phase locked loop (PLL) 20 according to the prior art. PLL 20 includes a phase detector 21, a loop filter 22, a voltage controlled oscillator (VCO) 23, and a loop divider 24. Phase detector 21 has a first input for receiving a signal labelled "REFERENCE CLOCK SIGNAL", a second input for receiving a signal labelled "LOOP CLOCK SIGNAL", and an output for providing a phase detect output signal. Loop filter 22 has an input connected to the output of phase detector 21 for receiving the phase detect output signal thereon, and an output. VCO 23 has an input connected to the output of loop filter 22, and an output for providing an output signal labelled "CLOCK OUTPUT SIGNAL". Loop divider 24 has an input connected to the output of VCO 23, and an output connected to the second input of phase detector 21 for providing LOOP CLOCK SIGNAL.

PLL 20 may be used in applications in which a low power is required, such as low-power telecommunications or the like. In these applications, PLL 20 is conventionally implemented in integrated circuit form as a digital PLL with complementary metal oxide semiconductor (CMOS) circuitry. CMOS circuitry is useful in low-power applications because virtually all the power dissipation occurs during switching. However, CMOS circuitry's power consumption increases proportionally to the amount of switching.

This relationship creates an inherent tradeoff between power consumption and performance for PLL 20. Phase detector 21 provides a continuous digital output in response to the phase difference between the reference clock and the divided loop clock. However, loop filter 22 must periodically sample the output of phase detector 21 and change its output accordingly. For example, if phase detector 21 indicates that the loop clock signal lags the reference clock signal, loop filter 22 must increase the value of the digital code at its output terminal in order to increase the frequency of CLOCK OUTPUT SIGNAL. As the sampling rate of loop filter 22 increases, loop filter 22 is better able to accurately reflect the phase relationship between REFERENCE CLOCK SIGNAL and LOOP CLOCK SIGNAL. This improved responsiveness lowers jitter in CLOCK OUTPUT SIGNAL, but at higher sampling speeds, loop filter 22 consumes more power. In order to reduce power consumption, it is thus desirable to reduce the sampling frequency of loop filter 22. However, as the sampling frequency of loop filter 22 decreases, loop filter 22 becomes less responsive to the phase difference between REFERENCE CLOCK SIGNAL and the LOOP CLOCK SIGNAL, increasing the jitter on CLOCK OUTPUT SIGNAL.

Figure 2:
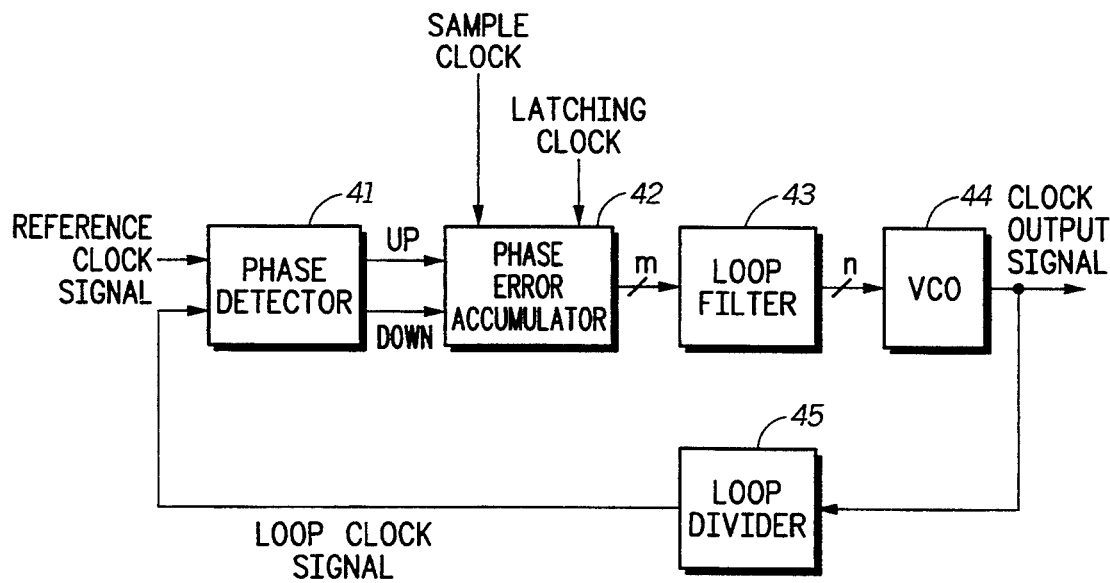
FIG. 2 illustrates in block diagram form a PLL according to the present invention.

FIG. 2 illustrates in block diagram form a PLL 40 according to the present invention. PLL 40 includes a phase detector 41, a phase error accumulator 42, a loop filter 43, a VCO 44, and a loop divider 45. Signal names in common with FIG. 1 retain their previous designations. Phase detector 41 has a first input for receiving REFERENCE CLOCK SIGNAL, a second input for receiving LOOP CLOCK SIGNAL, a first output for providing a first phase detect output signal labelled "UP", and a second output for providing a second phase detect output signal labelled "DOWN". REFERENCE CLOCK SIGNAL is a relatively low-frequency clock signal typically generated by an external oscillator (not shown) having a frequency designated "$F_{REF}$". Phase error accumulator 42 has a first input for receiving signal UP, a second input for receiving signal DOWN, a sample clock input for receiving a signal labelled "SAMPLE CLOCK", a latching clock input for receiving a signal labelled "LATCHING CLOCK", and an output terminal for providing an m-bit digital output word. Loop filter 43 has an input connected to the output of phase error accumulator 42, and an output for providing an n-bit digital output word. VCO 44 has an input connected to the output of loop filter 43, and an output for providing CLOCK OUTPUT SIGNAL. CLOCK OUTPUT SIGNAL is a relatively high-frequency clock output signal of PLL 40 having a frequency designated "$F_{OUT}$". $F_{OUT}$ is a multiple of $F_{REF}$ based on the value of loop divider 45. Loop divider 45 has an input connected to the output of VCO 44, and an output connected to the second input of phase detector 41 for providing LOOP CLOCK SIGNAL.

Phase detector 41 is a type-IV digital phase detector which provides its outputs with reference to the low-to-high transition of REFERENCE CLOCK SIGNAL and the high-to-low transition of LOOP CLOCK SIGNAL. Phase detector 41 activates signal UP at a logic high voltage to represent a condition in which LOOP CLOCK SIGNAL lags REFERENCE CLOCK SIGNAL, i.e., in which REFERENCE CLOCK SIGNAL makes a low-to-high transition before LOOP CLOCK SIGNAL makes a high-to-low transition. Phase detector 41 activates signal DOWN at a logic high voltage to represent a condition in which LOOP CLOCK SIGNAL leads REFERENCE CLOCK SIGNAL, i.e., in which LOOP CLOCK SIGNAL makes a high-to-low transition before REFERENCE CLOCK SIGNAL makes a low-to-high transition. Phase detector 41 pulses signals UP and DOWN for a time period approximately equal to the duration of the phase difference.

If the corresponding transitions of REFERENCE CLOCK SIGNAL and LOOP CLOCK SIGNAL occur within a small enough period, for example 1 ns, a conventional type IV phase detector enters an indeterminate state, and may provide either an UP pulse, a DOWN pulse, or no pulse at all. This indeterminateness results in clock signal jitter. In accordance with the present invention, phase detector 41 detects the occurrence of this indeterminate state, and automatically provides an UP pulse in response. This operation significantly reduces clock signal jitter because the forced UP pulses gradually and continuously increase the frequency of CLOCK OUTPUT SIGNAL instead of having UP and DOWN pulses randomly vary the frequency. Eventually, phase detector 41 is able to cleanly detect LOOP CLOCK SIGNAL leading REFERENCE CLOCK SIGNAL, providing a single DOWN pulse in response.

Figures 1, 3:
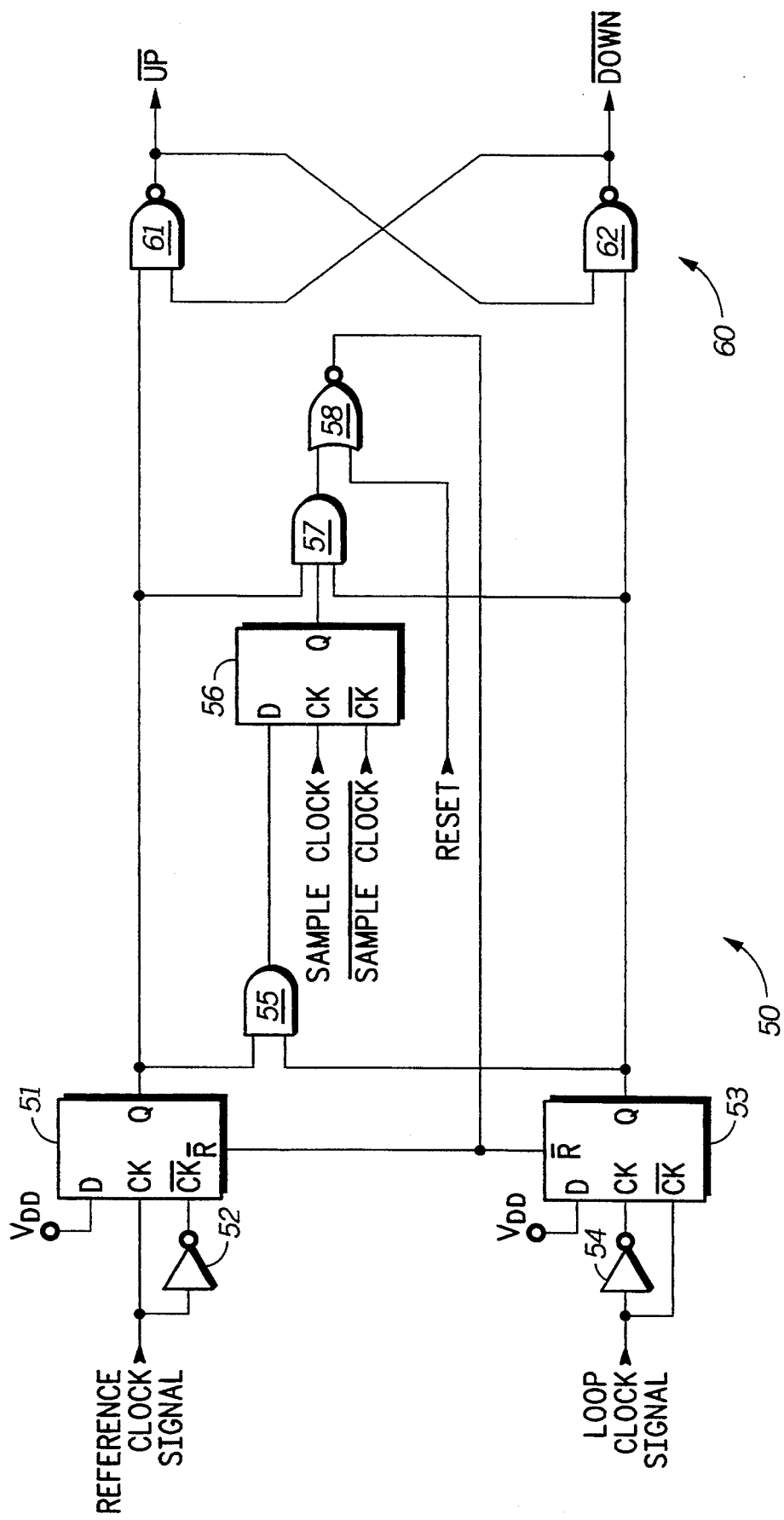
Figures 2, 3:
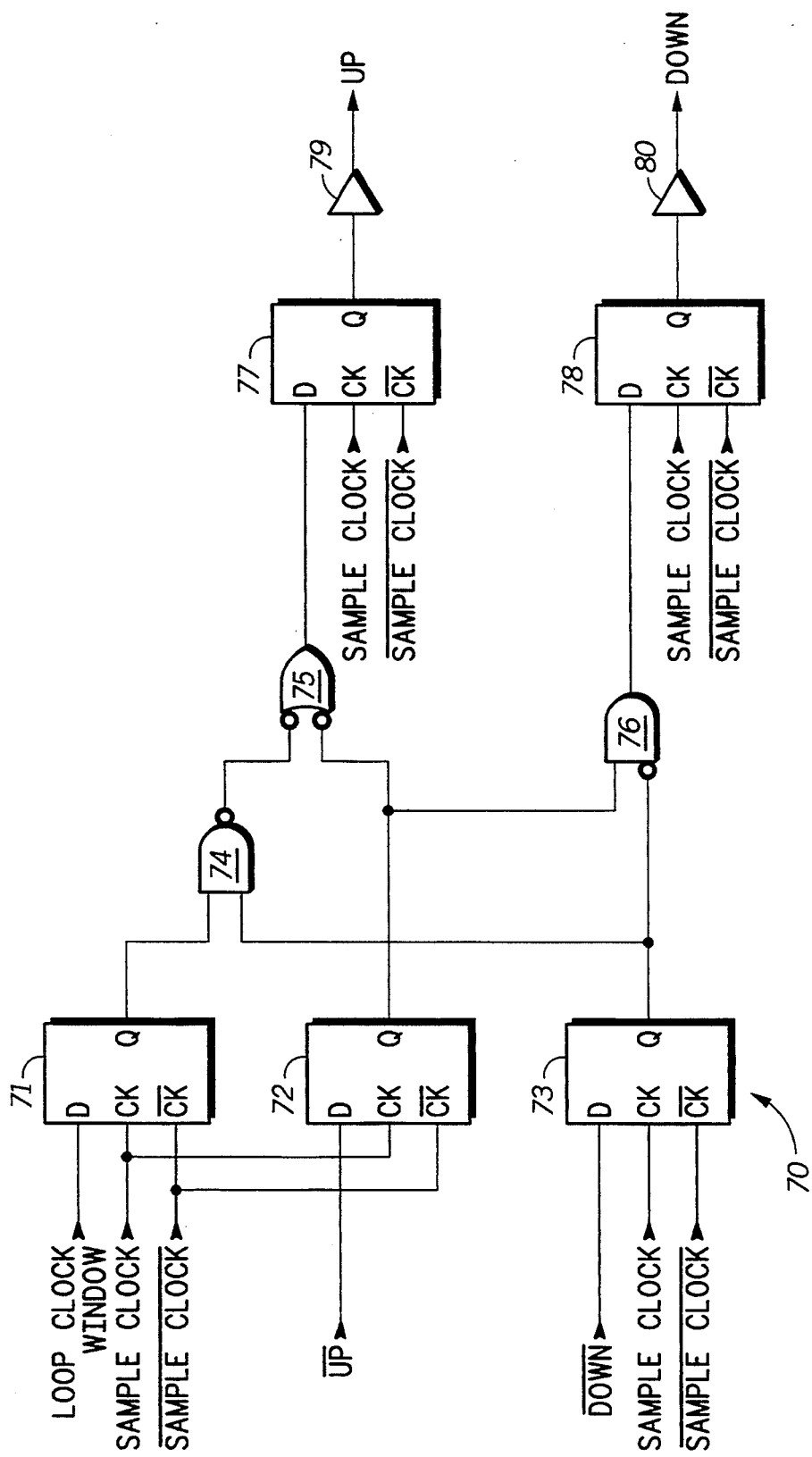

FIGS. 3-1 and 3-2 illustrate in partial block diagram and partial logic diagram form first and second portions, respectively, of phase detector 41 of FIG. 2. Considering FIGS. 3-1 and 3-2 together, phase detector 41 comprises generally a clock latching portion 50, a phase detector latch 60, and a resolution portion 70.

Clock latching portion 50 includes a D-type flip flop 51, an inverter 52, a D-type flip flop 53, an inverter 54, an AND gate 55, a D-type flip flop 56, an AND gate 57, and a NOR gate 58. Flip flop 51 has a data input terminal labelled "D" connected to a power supply voltage terminal labelled "$V_{DD}$", a true clock input terminal labelled "CK" for receiving REFERENCE CLOCK SIGNAL, a complementary clock input terminal labelled "$\overline{CK}$", a complementary reset input terminal labelled "$\overline{R}$", and a true output terminal labelled "Q". $V_{DD}$ is a more-positive power supply voltage representative of a true or logic high voltage having a nominal value of approximately 5 volts. Inverter 52 has an input terminal for receiving REFERENCE CLOCK SIGNAL, and an output terminal connected to the $\overline{CK}$ input terminal of flip flop 51. Flip flop 53 has a D input terminal connected to $V_{DD}$, a CK input terminal, a $\overline{CK}$ input terminal for receiving LOOP CLOCK SIGNAL, an $\overline{R}$ input terminal, and a Q output terminal. Inverter 54 has an input terminal for receiving LOOP CLOCK SIGNAL, and an output terminal connected to the CK input terminal of flip flop 53. AND gate 55 has a first input terminal connected to the Q output terminal of flip flop 51, a second input terminal connected to the Q output terminal of flip flop 53, and an output terminal. Flip flop 56 has a D input terminal connected to the output terminal of AND gate 55, a CK input terminal for receiving SAMPLE CLOCK, a $\overline{CK}$ input terminal for receiving a complement of signal SAMPLE CLOCK labelled "$\overline{\text{SAMPLE CLOCK}}$", and a Q output terminal. SAMPLE CLOCK is a high-speed clock having a frequency equal to $F_{OUT}/2$ in the illustrated embodiment. AND gate 57 has a first input terminal connected to the Q output terminal of flip flop 51, a second input terminal connected to the Q output terminal of flip flop 56, a third input terminal connected to the Q output terminal of flip flop 53, and an output terminal. NOR gate 58 has a first input terminal connected to the output terminal of AND gate 57, a second input terminal for receiving a signal labelled "RESET", and an output terminal connected to the $\overline{R}$ input terminals of flip flops 51 and 53.

Phase detector latch 60 includes NAND gates 61 and 62. NAND gate 61 has a first input terminal connected to the Q output terminal of flip flop 51, a second input terminal, and an output terminal for providing a signal labelled $\overline{UP}$. NAND gate 62 has a first input terminal connected to the output terminal of NAND gate 61, a second input terminal connected to the Q output terminal of flip flop 53, and an output terminal for providing a signal labelled "$\overline{DOWN}$". Note that signals $\overline{UP}$ and UP, and signals $\overline{DOWN}$ and DOWN are not truly complementary with respect to each other because of the operation of resolution portion 70, which will be explained below.

Resolution portion 70 includes D-type flip flops 71–73, a NAND gate 74, an OR gate 75, an AND gate 76, D-type flip flops 77 and 78, and buffers 79 and 80. Flip flop 71 has a D input terminal for receiving a clock signal labelled "LOOP CLOCK WINDOW", a CK input terminal for receiving SAMPLE CLOCK, a $\overline{CK}$ input terminal for receiving $\overline{\text{SAMPLE CLOCK}}$, and a Q output terminal. Flip flop 72 has a D input terminal for receiving signal $\overline{UP}$, a CK input terminal for receiving SAMPLE CLOCK, a $\overline{CK}$ input terminal for receiving $\overline{\text{SAMPLE CLOCK}}$, and a Q output terminal. Flip flop 73 has a D input terminal for receiving signal $\overline{DOWN}$, a CK input terminal of receiving SAMPLE CLOCK, a $\overline{CK}$ input terminal for receiving $\overline{\text{SAMPLE CLOCK}}$, and a Q output terminal. NAND gate 74 has a first input terminal connected to the Q output terminal of flip flop 71, a second input terminal connected to the Q output terminal of flip flop 73, and an output terminal. OR gate 75 has a first complementary input terminal connected to the output terminal of NAND gate 74, a second complementary input terminal connected to the Q output terminal of flip flop 72, and an output terminal. AND gate 76 has a true input terminal connected to the Q output terminal of flip flop 72, a complementary input terminal connected to the Q output terminal of flip flop 73, and an output terminal. Flip flop 77 has a D input terminal connected to the output terminal of OR gate 75, a CK input terminal for receiving SAMPLE CLOCK, a $\overline{CK}$ input terminal for receiving $\overline{\text{SAMPLE CLOCK}}$, and a Q output terminal. Flip flop 78 has a D input terminal connected to the output terminal of AND gate 76, a CK input terminal for receiving SAMPLE CLOCK, a $\overline{CK}$ input terminal for receiving $\overline{\text{SAMPLE CLOCK}}$, and a Q output terminal. Buffer 79 has an input terminal connected to the Q output terminal of flip flop 77, and an output terminal for providing signal UP. Buffer 80 has an input terminal connected to the Q output terminal of flip flop 78, and an output terminal for providing signal DOWN.

In operation, latching portion 50 captures selected edges of REFERENCE CLOCK SIGNAL and LOOP CLOCK SIGNAL in flip flops 51 and 53 for subsequent comparison in phase detector latch 60. Transitions on the outputs of flip flops 51 and 53 are determined by transitions on their respective inputs and thus are asynchronous with respect to each other. Either REFERENCE CLOCK SIGNAL or LOOP CLOCK SIGNAL will be leading with respect to the other, and the Q output of its corresponding flip flop will be initially active. When the selected transition of the lagging one of REFERENCE CLOCK SIGNAL and LOOP CLOCK SIGNAL occurs, then both outputs of flip flops 51 and 53 will be active, which causes the output of AND gate 55 to be active, and eventually activating the reset inputs of flip flops 51 and 53 after synchronization with SAMPLING CLOCK. Latching circuit 50 also provides an input for an external RESET signal to reset flip flops 51 and 53. In the illustrated embodiment, flip flop 51 captures a falling edge of LOOP CLOCK SIGNAL but a rising edge of REFERENCE CLOCK SIGNAL because the falling edge of REFERENCE CLOCK SIGNAL is pulse width modulated, by circuitry not shown, to convey additional signalling information. However, in other embodiments, any selected edge of either clock which is not modulated for signalling purposes or the like may be used.

Phase detector latch 60 is a conventional SR-type latch implemented with CMOS NAND gates 61 and 62. When one of flip flops 51 and 53 captures a selected edge of a corresponding one of REFERENCE CLOCK SIGNAL and LOOP CLOCK SIGNAL, phase detector latch 60 normally activates a selected one of signals $\overline{UP}$ and $\overline{DOWN}$ at a logic low. When the other selected clock edge occurs, phase detector latch 60 is reset and provides both signals $\overline{UP}$ and $\overline{DOWN}$ at an inactive state, a logic high. The length of time that the selected one of signals $\overline{UP}$ and $\overline{DOWN}$ are active corresponds to the amount of time REFERENCE CLOCK SIGNAL and LOOP CLOCK SIGNAL are out of phase, extended to and synchronized with the next rising edge of SAMPLE CLOCK. Resolution portion 70 subsequently samples signals $\overline{UP}$ and $\overline{DOWN}$ synchronously with SAMPLE CLOCK to provide discrete digital output signals UP and DOWN to phase error accumulator 42 of FIG. 2.

When LOOP CLOCK SIGNAL is closely locked to REFERENCE CLOCK SIGNAL, the selected clock edges line up closely in time. However, their transitions never occur at exactly the same time, and flip flops 51 and 53 are not synchronized to SAMPLE CLOCK. If the clock edges line up closely enough, phase detector latch 60, like all SR-type latches, goes into a metastable condition. The time delay between the clock edges required to put phase detector latch 60 into the metastable condition is approximately the gate delay through either NAND gate 61 or NAND gate 62. In present CMOS technology, this gate delay is approximately 1 ns, but will vary when different transistor processing technologies are used.

The metastable condition will cause the outputs of phase detector latch 60 to oscillate and the $\overline{\text{UP}}$ and $\overline{\text{DOWN}}$ signals may not resolve before flip flops 72 and 73 sample the state thereof on the next edge of SAMPLE CLOCK. In this circumstance, flip flops 72 and 73 will latch a random one of signals $\overline{\text{UP}}$ and $\overline{\text{DOWN}}$, which may not correspond to the actual phase difference between REFERENCE CLOCK SIGNAL and LOOP CLOCK SIGNAL. Thus, PLL 40 may randomly change the frequency when REFERENCE CLOCK SIGNAL and LOOP CLOCK SIGNAL are essentially locked, causing jitter on CLOCK OUTPUT SIGNAL.

In order to reduce this jitter, phase detector 41 detects the metastable condition and resolution portion 70 automatically activates a selected one of signals UP and DOWN (UP in the illustrated embodiment). Resolution portion 70 detects the metastable condition by sampling the outputs of flip flops 72 and 73 during a predetermined time period defined by signal LOOP CLOCK WINDOW. LOOP CLOCK WINDOW is a clock signal which is active during one full period of SAMPLE CLOCK for each period of LOOP CLOCK SIGNAL. This period of SAMPLE CLOCK is the period during which LOOP CLOCK SIGNAL makes a high-to-low transition. Resolution portion 70 thus provides signal UP if neither of the outputs of flip flops 72 and 73 become active during the period of time in which LOOP CLOCK WINDOW is active.

Specifically, NAND gate 74 provides a logic low at its output if, during the period in which signal LOOP CLOCK WINDOW is active at a logic high, the Q output of flip flop 72 (latched signal $\overline{\text{DOWN}}$) remains inactive at a logic high. OR gate 75 further provides a logic high if either, NAND gate 74 provides a logic low at its output, or the Q output of flip flow 72 is active at a logic high, i.e., a normal UP condition. AND gate 76 provides a logic high at its output if both flip flop 72 provides a logic high at its Q output terminal and flip flop 73 provides a logic low at its Q output terminal, thus preventing an illegal condition of both signals UP and DOWN being simultaneously active.

Returning to FIG. 2, phase error accumulator 42 samples and accumulates the number of UP and DOWN pulses based on SAMPLE CLOCK. Phase error accumulator 42 accumulates the UP and DOWN pulses over one period of LATCHING CLOCK. Each UP pulse increments the accumulated value, whereas each DOWN pulse decrements the accumulated value. On a given transition of LATCHING CLOCK, phase error accumulator 42 latches the accumulated value and provides this accumulated value to loop filter 43. The value of m is equal to a base-two number sufficiently large to express the ratio of the period of LATCHING CLOCK to SAMPLE CLOCK. In the illustrated embodiment, SAMPLE CLOCK has a frequency of ($F_{OUT}/2$), and LATCHING CLOCK has a frequency of $F_{REF}$.

Figure 4:
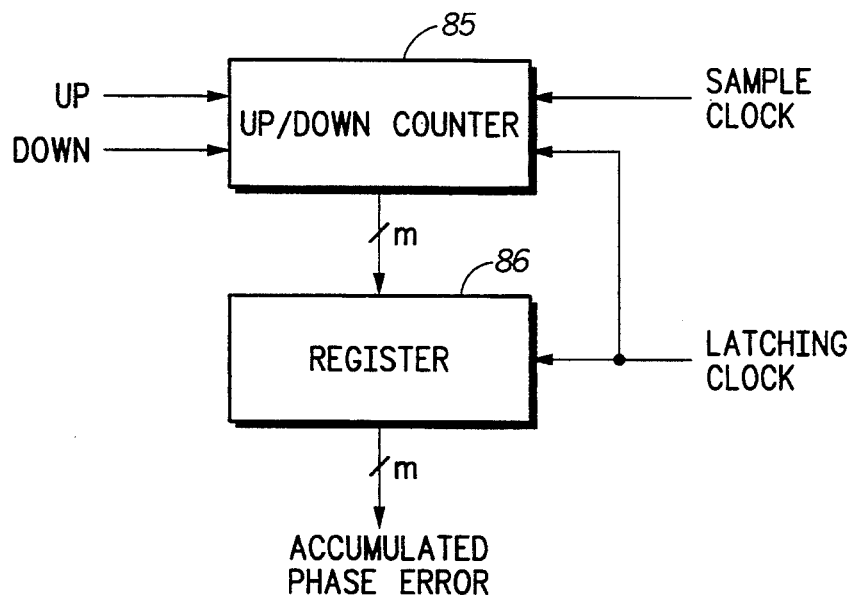
FIG. 4 illustrates in block diagram form the phase error accumulator of FIG. 2.

The function and operation of phase error accumulator 42 are better understood with reference to FIG. 4, which illustrates in block diagram form phase error accumulator 42 of FIG. 2. Phase error accumulator 42 includes an up/down counter 85, and a register 86. Up/down counter 85 has an increment input for receiving signal UP, a decrement input for receiving signal DOWN, a clock input terminal for receiving SAMPLE CLOCK, a reset input terminal for receiving LATCHING CLOCK, and an m-bit output terminal. Up/down counter 85 samples the output of phase detector 41 of FIG. 2 by counting either up or down, if signals UP or DOWN, respectively, are active on a predetermined transition of SAMPLE CLOCK. On a predetermined transition of LATCHING CLOCK, the state of counter 85 is latched into register 86 and counter 85 is reset to zero. Register 86 provides this m-bit value as a signal labelled "ACCUMULATED PHASE ERROR" to loop filter 43 of FIG. 2. It should be appreciated that different counters are required when other types of phase detectors are used.

Figure 5:
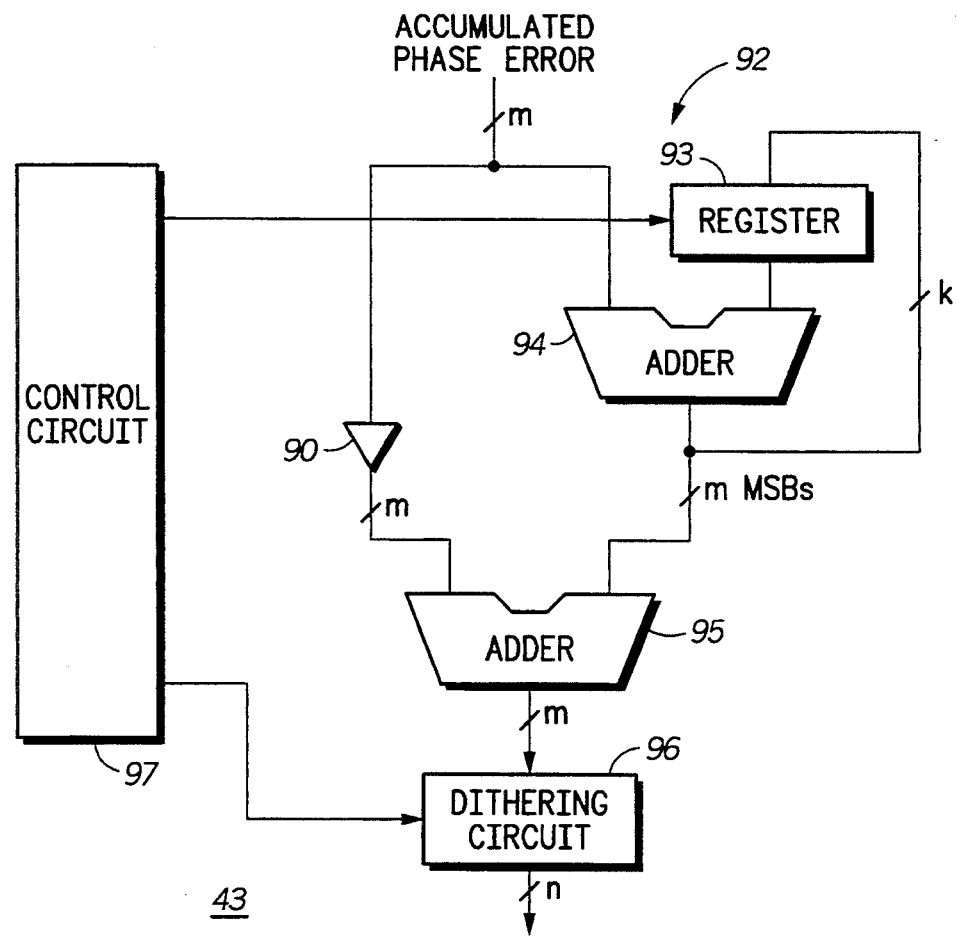
FIG. 5 illustrates in block diagram form the loop filter of FIG. 2.

Again returning to FIG. 2, loop filter 43 and VCO 44 may each be known digital elements, such as the loop filter and VCO taught by Shawn R. McCaslin in U.S. Pat. No. 5,036,294, issued Jul. 30, 1991, entitled "Phase Locked Loop Having Low-Frequency Jitter Compensation", assigned to the assignee hereof. However, loop filter 43 is preferably implemented as illustrated in FIG. 5, the description of which is helpful to understanding how a PLL with phase error accumulator 42 saves power. FIG. 5 illustrates in block diagram form loop filter 43 of FIG. 2. Loop filter 43 includes a multiplier 90, an integral term portion 92, an adder 95, a dithering circuit 96, and a control circuit 97. Multiplier 90 has an input for receiving the m-bit output of phase error accumulator 42, and an output for providing an m-bit output signal. Multiplier 90 multiplies the output of phase error accumulator 42 by a factor designated "A", and may be implemented in a variety of ways. For example, in the illustrated embodiment, multiplier 90 performs a multiply-by-two operation by shifting the m bits by one bit position, and by setting the least significant bit to a zero.

Integral term portion 92 includes a register 93 and an adder 94. Register 93 has an input for receiving a k-bit output of adder 94, and an output connected to an input of adder 94. Another input of adder 94 receives the output of phase error accumulator 42. Adder 95 has a first input for receiving the m-bit output of multiplier 90, a second input for receiving m most significant bits (MSBs) of the output of adder 94, and an output for providing an m-bit sum thereof. Dithering circuit 96 receives the m-bit output of adder 95 and provides an n-bit output code to VCO 44. Dithering circuit 96 compensates for low frequency jitter as taught by U.S. Pat. No. 5,036,294. Control circuit 97 has outputs connected to register 93 and dithering circuit 96 for controlling the operation thereof.

In loop filter 43, adders 94 and 95 are fully static using CMOS technology. Thus, they switch only when their inputs change and they consume substantially all of their power when switching. Since phase error accumulator 42 causes ACCUMULATED PHASE ERROR to switch only once for every period of LATCHING CLOCK, PLL 40 saves the power consumed by adders 94 and 95 not switching once for every period of SAMPLE CLOCK.

Referring again to FIG. 2, PLL 40 also has a stable closed-loop frequency response for typical clock values. When $F_{REF} = 8$ kilohertz (kHz), $F_{OUT} = 20.48$ megahertz (MHz), SAMPLE CLOCK $= F_{OUT}/2 = 10.24$ MHz, LATCHING CLOCK $= F_{REF} = 8$ kHz, $m=11$, $k=22$, $n=5$, and $A=2$, PLL 40 has a frequency response which creates an additional pole compared to PLL 20. However, this pole is very near the origin and thus PLL 40 suffers no stability degradation. Although no stability problems are believed to exist, further stability analysis using conventional simulation techniques is desirable for PLLs with other parameters.

While the invention has been described in the context of a preferred embodiment, it will be apparent to those skilled in the art that the present invention may be modified in numerous ways and may assume many embodiments other than that specifically set out and described above. For example, the illustrated PLL may be constructed with different types of phase detectors, and the illustrated phase detector may be used in different PLLs. The circuitry used for the phase error accumulator must be adjusted accordingly. In addition, conventional loop filters, VCOs, and loop dividers may also be used. Note that values for m and n may vary when the PLL incorporates additional functions, such as scan testing, dithering to reduce clock jitter, and the like. Accordingly, it is intended by the appended claims to cover all modifications of the invention which fall within the true spirit and scope of the invention.

We claim:

1. A low-power, jitter-compensated phase locked loop, comprising:

a phase detector having a first input for receiving a reference clock signal, a second input for receiving a loop clock signal, and an output, said phase detector providing a phase detect output signal at said output in response to a phase difference between said reference clock signal and said loop clock signal;

phase error accumulation means coupled to said phase detector, for periodically sampling said phase detect output signal with a sample clock, and for accumulating over a predetermined number of periods of said sample clock an accumulated phase error, said phase error accumulation means including a counter and a register;

said counter having an input coupled to said output of said phase detector, a clock input for receiving said sample clock, a reset input for receiving a latching clock, and an output;

said register having an input coupled to said output of said counter, a latch input terminal for receiving said latching clock, and an output coupled to an input of a loop filter;

said latching clock characterized as being derived from said reference clock signal;

said loop filter having said input coupled to said output of said register for receiving said accumulated phase error, and an output for providing a filtered output;

a voltage controlled oscillator having an input coupled to said output of said loop filter, and an output for providing a clock output signal of the phase locked loop; and a loop divider having an input for receiving said clock output signal of the phase locked loop, and an output for providing said loop clock signal.

2. The phase locked loop of claim 1 wherein said phase detector is characterized as being an up/down phase detector, and wherein said counter is characterized as being an up/down counter.

3. The phase locked loop of claim 1 wherein a frequency of said latching clock and a frequency of said reference clock signal are equal.

4. A low-power, jitter-compensated phase locked loop, comprising:

a phase detector having a first input terminal for receiving a reference clock signal, a second input terminal for receiving a loop clock signal, and an output terminal;

a phase error accumulator having an input terminal coupled to said output terminal of said phase detector, a sample clock input terminal for receiving a sample clock, a latching clock input terminal for receiving a latching clock, and an output terminal, said phase error accumulator including a counter and a register;

said counter having an input terminal coupled to said output terminal of said phase detector, a clock input terminal for receiving said sample clock, a reset input terminal for receiving said latching clock, and an output terminal;

said register having an input terminal coupled to said output terminal of said counter, a latch input terminal for receiving said latching clock, and an output terminal coupled to an input terminal of a loop filter;

said latching clock characterized as being derived from said reference clock signal;

a voltage controlled oscillator having an input terminal coupled to an output terminal of said loop filter, and an output terminal for providing a clock output signal of the phase locked loop; and a loop divider having an input terminal coupled to said output terminal of said voltage controlled oscillator, and an output terminal coupled to said second input terminal of said phase detector.

5. The phase locked loop of claim 4 wherein a frequency of said latching clock and a frequency of said reference clock signal are equal.

6. The phase locked loop of claim 4 wherein said phase detector is characterized as being an up/down phase detector, and wherein said counter is characterized as being an up/down counter.

7. In a phase locked loop, a method for reducing power while maintaining low jitter, comprising the steps of:

detecting a phase difference between a reference clock signal and a loop clock signal to provide a phase detect signal;

sampling said phase detect signal on a predetermined transition of a sample clock;

accumulating a plurality of samples of said phase detect signal and providing an accumulated phase error synchronously with a latching clock, said latching clock characterized as being derived from said reference clock signal;

filtering said accumulated phase error in a loop filter; and providing a clock output signal of the phase locked loop having a frequency proportional to an output of said loop filter.

8. The method of claim 7 further comprising the step of dividing said clock output signal of the phase locked loop by a predetermined number to provide said loop clock signal.

9. The method of claim 7 wherein said step of sampling said phase detect signal on said predetermined transition of said sample clock comprises the step of selectively incrementing or decrementing a counter on said predetermined transition of said sample clock in response to said phase detect signal.

10. The method of claim 9 wherein said step of filtering said accumulated phase error in said loop filter further comprises the step of filtering said accumulated phase error in a digital loop filter.

11. A low-power, jitter-compensated phase locked loop, comprising:

a phase detector having a first input terminal for receiving a reference clock signal, a second input terminal for receiving a loop clock signal, and an output terminal, said phase detector comprising a phase detector latch for determining a phase difference between said reference clock signal and said loop clock signal;

a loop filter having an input terminal coupled to said output terminal of said phase detector, and an output terminal;

a voltage controlled oscillator having an input terminal coupled to said output terminal of said loop filter, and an output terminal for providing a clock output signal of the phase locked loop; and a loop divider having an input terminal coupled to said output terminal of said voltage controlled oscillator, and an output terminal coupled to said second input terminal of said phase detector;

said phase detector providing an up signal in response to said phase detector latch detecting a first predetermined transition of said reference clock signal leading a second predetermined transition of said loop clock signal;

said phase detector providing a down signal in response to said phase detector latch detecting said first predetermined transition of said loop clock signal leading said second predetermined transition of said reference clock signal;

said phase detector providing a predetermined one of said up signal and said down signal in response to a metastable condition of said phase detector latch.

12. The phase locked loop of claim 11 wherein said phase detector further comprises resolution means coupled to said phase detector latch, for providing said predetermined one of said up and down signals in response to said phase detector latch being in said metastable condition during a predetermined time period.

13. The phase locked loop of claim 12 wherein said predetermined time period comprises an interval during which said loop clock signal makes said second predetermined transition.

14. The phase locked loop of claim 12 wherein said resolution means further provides said predetermined one of said up signal and said down signal in response to said phase detector latch simultaneously providing both said up signal and said down signal.

15. The phase locked loop of claim 11 further comprising a phase error accumulator coupled between said output terminal of said phase detector and said input terminal of said loop filter.

16. The phase locked loop of claim 15 wherein said phase error accumulator has an input terminal coupled to said output terminal of said phase detector, a sample clock input terminal for receiving a sample clock, a latching clock input terminal for receiving a latching clock, and an output terminal coupled to said input terminal of said loop filter.

17. In a phase locked loop, a phase detector comprising:

latching means for receiving a reference clock signal and a loop clock signal, and for providing first and second output signals thereof in response to first and second transitions of said reference clock signal and said loop clock signal, respectively;

a phase detector latch having a first input terminal for receiving said first output signal of said latching means, a second input terminal for receiving said second output signal of said latching means, a first output terminal for providing a first output signal thereof, and a second output terminal for providing a second output signal thereof;

said phase detector latch providing said first output signal thereof in response to detecting said first output signal of said latching means leading said second output signal of said latching means;

said phase detector latch providing said second output signal thereof in response to detecting said second output signal of said latching means leading said first output signal of said latching means; and resolution means coupled to said phase detector latch, for providing an up signal in response to said first output signal of said phase detector latch, for providing a down signal in response to said second output signal of said phase detector latch, and for providing a predetermined one of said up and down signals in response to said phase detector latch being in a metastable condition during a predetermined time period.

18. The phase detector of claim 17 wherein said predetermined time period comprises an interval during which said loop clock signal makes said second transition.

19. The phase detector of claim 17 wherein said resolution means further provides said predetermined one of said up signal and said down signal in response to said phase detector latch simultaneously providing both said up signal and said down signal.

20. The phase detector of claim 17 wherein said phase detector latch comprises:

a first NAND gate having a first input terminal for receiving said first output signal of said latching means, a second input terminal, and an output terminal for providing said first output signal of said phase detector latch; and a second NAND gate having a first input terminal coupled to said output terminal of said first NAND gate, a second input terminal for receiving said second output signal of said latching means, and an output terminal for providing said second output signal of said phase detector latch.

21. In a phase locked loop, a method for detecting a phase difference between a loop clock signal and a reference clock signal in order to provide a clock output signal with low jitter, comprising the steps of:

activating a set input of a phase detector latch in response to a first predetermined transition of the reference clock signal leading a second predetermined transition of the loop clock signal;

activating a reset input of said phase detector latch in response to said second predetermined transition of the loop clock signal leading said first predetermined transition of the reference clock signal;

providing an up signal in response to a true output of said phase detector latch;

providing a down signal in response to a complement output of said phase detector latch;

detecting a metastable condition in said phase detector latch; and activating a predetermined one of said up signal and said down signal in response to said metastable condition in said phase detector latch.

22. The method of claim 21 wherein said step of detecting comprises the step of detecting said metastable condition as a condition in which both said up signal and said down signal are inactive during a predetermined time period.

* * * * *